United States Patent [19]
Gilbert et al.

[11] Patent Number: 5,636,138
[45] Date of Patent: Jun. 3, 1997

[54] JUMPER CABLE SELECTION AND ROUTING SYSTEM

[75] Inventors: Albon E. Gilbert, Lilburn, Ga.; Alexander Petrunia, Allentown, Pa.; Randy A. Reagan, Morris Plains, N.J.

[73] Assignee: Lucent Technologies Inc., Murray Hill, N.J.

[21] Appl. No.: 326,306

[22] Filed: Oct. 20, 1994

Related U.S. Application Data

[63] Continuation of Ser. No. 998,165, Dec. 29, 1992, abandoned.

[51] Int. Cl.$^6$ ................................................ H02G 1/00
[52] U.S. Cl. ............................................................ 364/512
[58] Field of Search .................................. 179/98; 439/207; 324/66; 364/492, 491, 505, 490, 488, 512

[56] References Cited

U.S. PATENT DOCUMENTS

| | | | |
|---|---|---|---|
| 4,320,261 | 3/1982 | Scerbo et al. | 361/826 |
| 4,484,292 | 11/1984 | Hong et al. | 364/491 |
| 4,615,011 | 9/1986 | Linsker | 364/491 |
| 4,852,016 | 7/1989 | McGehee | 364/491 |
| 4,901,004 | 2/1990 | King | 324/66 |
| 5,021,968 | 6/1991 | Ferketic | 364/505 |
| 5,038,294 | 8/1991 | Arakawa et al. | 364/491 |
| 5,057,675 | 10/1991 | Gustason | 235/70 |
| 5,149,277 | 9/1992 | Le Master | 439/207 |
| 5,245,550 | 9/1993 | Miki et al. | 364/490 |
| 5,295,082 | 3/1994 | Chang et al. | 364/490 |
| 5,309,372 | 5/1994 | Marui et al. | 364/491 |
| 5,500,804 | 3/1996 | Honsinger et al. | 364/488 |

OTHER PUBLICATIONS

Bellcore Technical Advisory #TA-OPT-000449, Issue 2, Mar., 1991 "Generic Requirements and Design Considerations for Fiber Distributing Frames".

*Primary Examiner*—Kevin J. Teska
*Assistant Examiner*—Russell W. Frejd
*Attorney, Agent, or Firm*—Ronald D. Slusky; John A. Caccuro

[57] ABSTRACT

A method and a system are provided to determine the optimum non-congested path to connect two termination points on a distributing frame with a specific type of jumper cable. The length of the jumper cable to be routed through the path is calculated and subsequently a measurement of the same cable and associated slack is displayed on a screen along with the non-congested path with a representation of the cable and slack therein.

23 Claims, 5 Drawing Sheets

JUMPER CABLE SELECTION AND ROUTING SYSTEM

RELATED APPLICATIONS

This application is a continuation of application Ser. No. 07/998,165, filed Dec. 29, 1992, now abandoned.

TECHNICAL FIELD

This invention relates to cable distribution systems and, more particularly, to a method and system for selecting and routing jumper cables for such systems.

BACKGROUND OF THE INVENTION

Deployment of modular cable distribution systems has dramatically increased over the last few years primarily because these systems provide a cost-effective means for fast circuit provisioning, speedy facility reconfiguration and convenient test access. Typically, a modular cable distribution system includes one or more distributing frames comprised of a number of bays, also called "terminal blocks," in which are inserted distribution shelves housing a number of connector panels, also called "patch panels." The connector panels provide a number of termination points to which a variety of devices can be connected. A distributing frame also includes a base and other ancillary supporting hardware (brackets, retainers) designed to form conduits, such as horizontal raceways and vertical troughs, through which jumper cables (also called "patch cords" or "jumpers" for short) connecting two termination points are routed. Because a jumper cable connecting two termination points can be routed through different paths in those conduits, techniques have been devised to determine the most economical path to route a specific type of jumper cable and to estimate the associated length of that cable.

SUMMARY OF THE INVENTION

In accordance with the invention, it is recognized that the conventional techniques have certain shortcomings. For example, they do not include a route selection method to enable the jumper cables to be guided through the conduits of a cable distribution system without congesting them. Because conduit congestion complicates the task of jumper tracing and removal, industry standards have been defined to limit the amount of so-called "jumper pile-up" in conduits to some threshold capacity. One such standard is set forth for Fiber Distributing Frames in Bellcore Technical Advisory TA-OPT-000449 issued Mar. 2, 1991. Other shortcomings of the prior art include a) lack of a graphical display for a selected path to assist cable installers in the task of properly routing a jumper cable in that path, b) absence of a general systematic approach to calculate jumper cable length for different types of cables and various types of distributing frames, and c) lack of simple method for storing and routing excess slack cordage in the conduits of a distributing frame.

In accordance with the invention, the optimal length of a jumper cable to connect two termination points on one or more distributing frames is derived by selecting the shortest jumper cable routing path that is non-congested.

In exemplary embodiments of the invention, a user identifies the coordinates of the termination points to be connected. Those coordinates—along with other information, such as a) the physical characteristics and the relative position of the bay(s) within the frame, b) the type of jumper cable (optical, metallic), and c) the existing jumper pile-up in specific raceways and troughs—are used to determine the shortest path for a jumper cable to connect the two termination points. Subsequently, a determination is made as to whether any section of that path has a congestion level above the maximum jumper pile-up threshold defined in the aforementioned industry standards. If it does, the next shortest alternate non-congested path is derived and an associated jumper cable length is computed. Thereafter, the selected non-congested path, with an illustrative graphical representation of the cable therein, is displayed on a screen along with a measurement of the jumper cable length.

A feature of the invention is to select and display on a screen an optimal non-congested path with a graphical representation of the cable therein, when a user provides to the jumper cable selection and routing system the coordinates of two termination points and the length of the jumper cable to connect those points. As an aspect of the invention, slack loops are explicitly shown in the geographical representation.

Another feature of the invention permits a database to be queried to select a premanufactured jumper cable length closest to the optimal length calculated in accordance with the principles of this invention.

DETAILED DESCRIPTION

Figure 1:
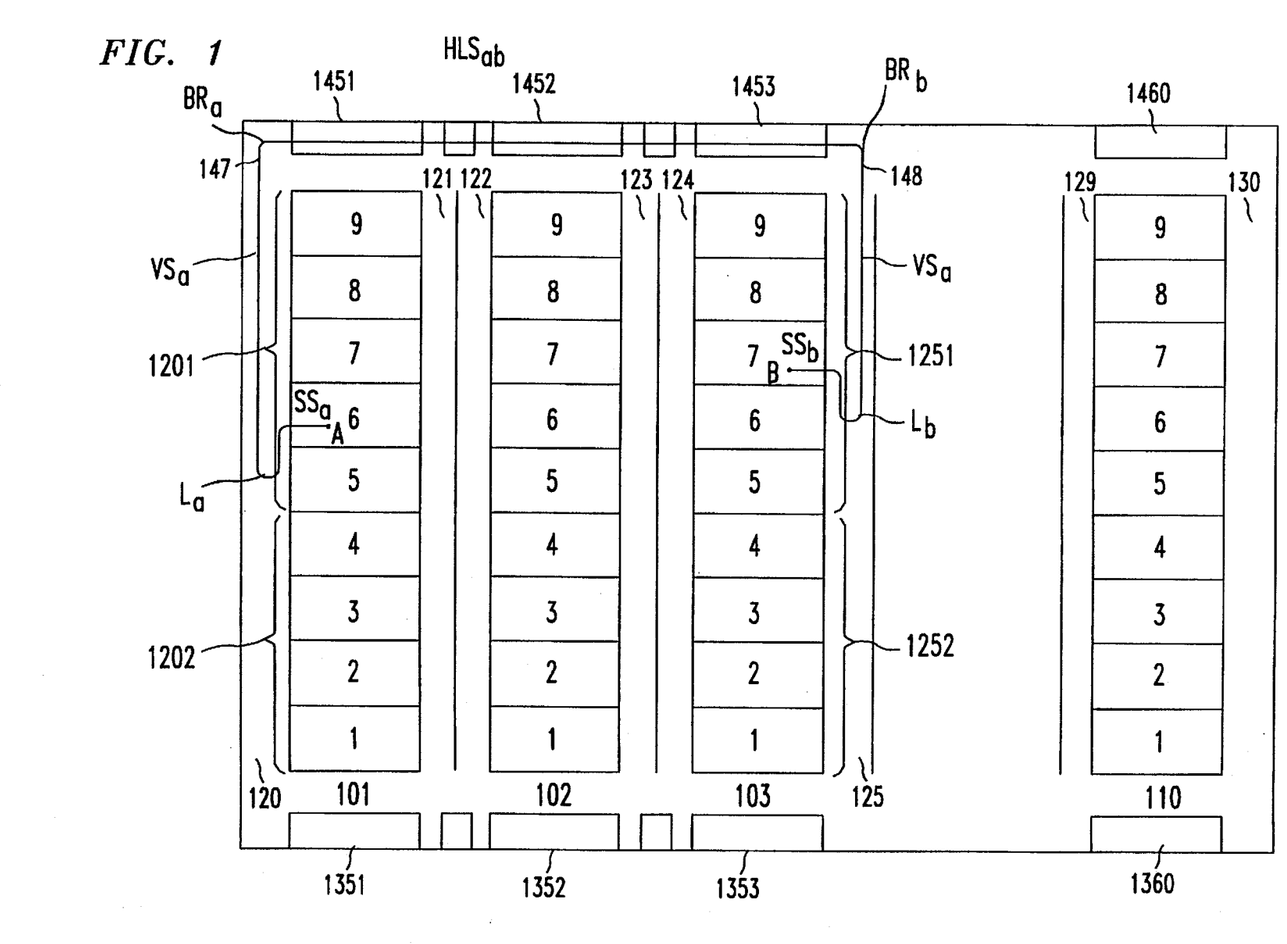
FIG. 1 is a schematic representation of a fiber distributing frame for a modular cable distribution system.

FIG. 1 is a schematic representation of a fiber distributing frame for a modular cable distribution system. As shown in FIG. 1, distributing frame 100 which may be for example, an AT&T LGX® distributing frame, includes the bays 101 to 110 which have a number of slots marked 1 to 9. Each slot in a bay accommodates a distribution shelf in which are inserted connector panels having a number of termination points. In this example, each bay in distributing frame 100 is identical in terms of height and length. The bays in frame 100 are uniformly spaced apart to form the vertical troughs 120 to 130 through which jumper cables are routed. Each vertical trough is divided into two segments namely, a first segment associated with the top five distribution shelves and a second segment associated with the bottom four shelves. For example, vertical trough 120 is comprised of segments 1201 and 1202. Similarly, vertical trough 125 is comprised of segments 1251 and 1252.

Shown at the bottom of distributing frame 100 is lower horizontal raceway 135, which forms part of the supporting structure for frame 100. Lower raceway 135 is ordinarily used to route jumper cables from distribution shelves in the lower half of a bay (slots 1 to 4) to distribution shelves in the same bay or another bay. Lower raceway 135 is divided into sections, each section being associated with the specific bay that it faces. For example, section 1351 is associated with bay 101 and section 1352 is associated with bay 102. Shown at the top of frame 100 is upper horizontal raceway 145 which typically provides a conduit for jumper cables from distribution shelves in the upper half of a bay (slots 5 to 9) to other distribution shelves in the same bay or another bay. Upper raceway 145 is also divided into subsections 1451 to 1460, each one being associated with the bay that it faces.

Also shown in FIG. 1 is a particular jumper cable connecting a) a termination point A in a distribution shelf inserted in slot 6 of bay 101 and b) a termination point B in a distribution shelf inserted in slot 7 of bay 103. The jumper cable connecting termination points A and B is comprised of a) shelf segments $SS_a$ and $SS_b$, which represent the portions of the jumper cable routed through a concave wall located at the bottom of each distribution shelf, b) slack loop segments $L_a$ and $L_b$ that are needed to prevent the fiber jumper cable of this example from being pulled too tightly and also to allow for easier jumper tracing and removal, c) vertical segments $VS_a$ and $VS_b$ that are routed through vertical troughs 120 and 125, respectively, and d) horizontal length segment $HLS_{ab}$ that is routed through the upper raceway 145. Thus, the exact jumper cable length EL required to cross-connect any two points, with the recommended nominal slack loops, can be calculated by adding the jumper cable segments shown in FIG. 1. That is, $$EL = SS_a + L_a + VS_a + HLS_{ab} + VS_b + L_b + SS_b$$

In FIG. 1, vertical segments $VS_a$ and $VS_b$ represent jumper lengths between the upper raceway and the entrances to starting shelf 6 in bay 101 and ending shelf 7 in bay 103, respectively. At the starting shelf (shelf 6 in this example), the vertical segment is defined as $VS_a=(10-SSN)SH+\delta$, and at the ending shelf (shelf 7 in this example) the vertical segment is defined as $VS_b=(10-ESN)SH+\delta$ where, SSN=starting shelf number (1, 2, ..., 9), ESN=ending shelf number (1, 2, ..., 9), SH=shelf height, and $\delta$=distance between upper raceway and uppermost shelf. The factor "10" in this relationship is arrived by adding unity to the number of shelves within a bay i.e., 1+9 in this example.

Horizontal length component $HLS_{ab}$ is composed of horizontal jumper sections associated with the starting bay, the ending bay and any intermediate bays. When cross-connecting shelves within the same bay, starting and ending bays are the same and therefore no intermediate bay is present. Similarly, there is no intermediate bay when interconnecting shelves within adjacent bays. Also included in the calculation of the $HLS_{ab}$ are bend radius lengths $BR_a$ 147 and $BR_b$ 148 entering and exiting upper raceway 145. The lengths of $BR_a$ 147 and $BR_b$ 148 are typically negligible for metallic cables, except for coaxial cables. Thus, the length of $HLS_{ab}$ is a function of a) the length of the bay(s) (starting, ending and intermediate when applicable), b) the distance between bays, and c) the bend radius lengths of the jumper cable entering and exiting upper raceway 145.

Figure 2:
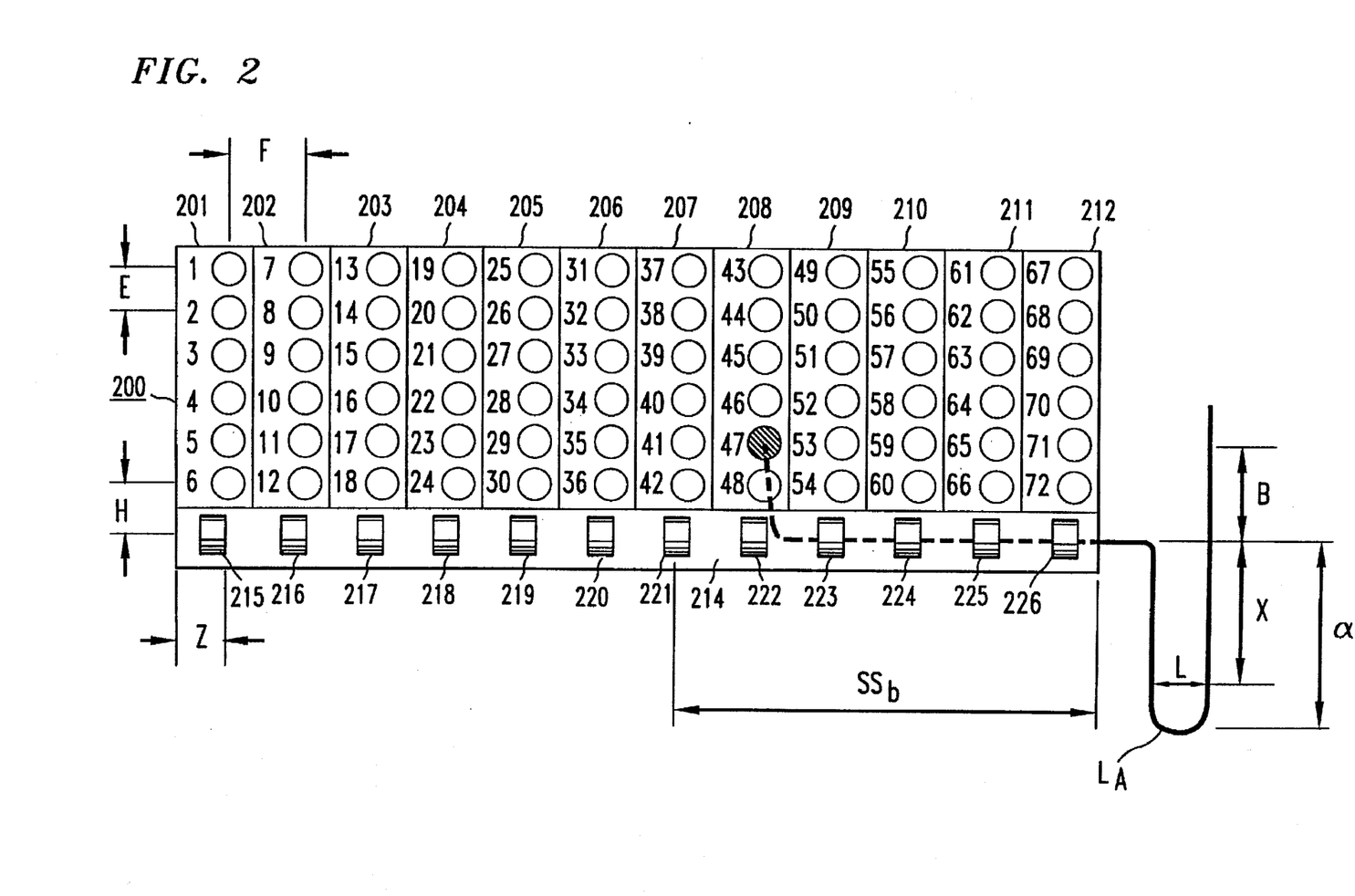
FIG. 2 shows a number of optical connector panels inserted in a distribution shelf and a section of a jumper cable connected to one of the termination points with a slack loop in the cable.

FIG. 2 shows a front view of distribution shelf 200 to be inserted in one of the bays of distributing frame 100. Inserted in shelf 200 are a number of optical connector panels 201 to 212. Each connector panel in distribution shelf 200 provides six termination points, for optical jumper cables. On the back of the connector panels (not shown), the termination points are connected to feeder cables linking each termination point to a specific end-user device or a port of some type of processing equipment (central office switch, PBX, or computer). Within shelf 200, termination points are progressively numbered from top to bottom and from left to right—in this case, from 1 to 72. In addition, the vertical spacing denoted by distance E and the horizontal spacing denoted by distance F between adjacent termination points are fixed. At the bottom of distribution shelf 200 is a concave wall which forms horizontal duct 214 serving as a conduit leading to the vertical troughs on each side of the shelf. Fiber rings, such as fiber rings 215 to 226 are mounted on the edges of duct 214 to retain jumper cables routed through duct 214. The vertical distance from a connector at the bottom of shelf 200 to the nearest fiber ring is indicated by distance H. Similarly, distance Z measures the distance between the edge of shelf 200 and the first fiber ring 226.

As indicated above, the length of the shelf segment is the length of the jumper cable spanning from the fiber optic connector coupling of a connector panel in shelf 200 to the end of the fiber bend guide at the entrance of the shelf, as shown in FIG. 2. The shelf segment in FIG. 2 is indicated by the broken line spanning from termination point 47 to the edge of shelf 200. Its length is dependent on the relative position of a fiber optic connector panel within shelf 200 and on the direction by which the jumper cable enters or exits shelf 200. In accordance with the invention, connectors located on the left hand side of a shelf typically exit to the left while connectors located on the right hand side of a shelf exit to the right in order to minimize congestion in the vertical troughs adjacent to the shelf. In this example, in the absence of congestion, connectors 1 to 36 in shelf 200 would exit to the left while connectors 37 to 72 would exit to the right.

The general equation for the length of a shelf segment, $SS_i$, is given by $$SS_i = Z + H + E(n - C_i) + mF$$

where, $C_i$=starting or ending connector number (1 to 72), i=starting or ending connector designator=a or b, respectively, m=panel location factor relative to a shelf, see Table 3, n=connector location factor relative to a panel, see Table 3, E=distance between connectors in a panel F=distance between connector panels H=distance from fiber ring to 1st connector Z=distance between end of shelf to 1st fiber ring Table 3 shown below illustrates connector location factors for the shelf of FIG. 2.

| Connector Number $C_i$ | m Exit Left | m Exit Right | n |
|---|---|---|---|
| 1–6 | 0 | 11 | 6 |
| 7–12 | 1 | 10 | 12 |
| 13–18 | 2 | 9 | 18 |
| 19–24 | 3 | 8 | 24 |
| 25–30 | 4 | 7 | 30 |
| 31–36 | 5 | 6 | 36 |
| 37–42 | 6 | 5 | 42 |
| 43–48 | 7 | 4 | 48 |
| 49–54 | 8 | 3 | 54 |

-continued

| Connector Number $C_i$ | m Exit Left | m Exit Right | n |
| --- | --- | --- | --- |
| 55–60 | 9 | 2 | 60 |
| 61–66 | 10 | 1 | 66 |
| 67–72 | 11 | 0 | 72 |

The panel connector factor is associated with a panel within shelf 200 and is used to calculate the horizontal distance from the connector to the vertical edge of shelf 200. Similarly the n factor identifies the connector within the panel and is used to calculate the vertical distance from the connector to duct 214. The panel connector factor can have two different values depending on whether the jumper cable exits to the left or exits to the right. The left and right exit alternatives allow a jumper cable to be routed in two different directions to avoid potential congestion in segments of the vertical troughs and sections of the upper and lower raceways. As shown on the first row of Table 3, when a jumper cable from a termination point in the first connector panel exits left, a value of "0" will be assigned to the factor m. By contrast, the factor m will take a value of "11" when a cable exits to the right. The values of 0 and 11 reflect the relative proximity of the connector panel to the vertical troughs in the bay. Table 3 also indicates the different values assigned to the factor n for specific connector points.

Referring back to FIG. 2, at the bottom of that figure and on the right hand side is shown a nominal slack loop which is ordinarily recommended for optical jumper cables and some metallic jumper cables, such as coaxial cables to prevent them from being pulled too tightly. The vertical distance, α, of the small loops is defined by $$\alpha = x + \frac{D}{2},$$

and the linear length, $L_a$, of the nominal slack loop is defined by $$L_a = 2x + \pi \left(\frac{D}{2}\right),$$

where x=vertical component of the loop

D=loop diameter

There may also be applications where the small loops can not be accommodated, resulting in a shorter transition length. The vertical distance, β, of the short transition length is defined by $$\beta = \frac{D}{2},$$

and the shorter transition length, $L_a$ is defined by $$L_a = \pi \frac{D}{4}.$$

Figure 3:
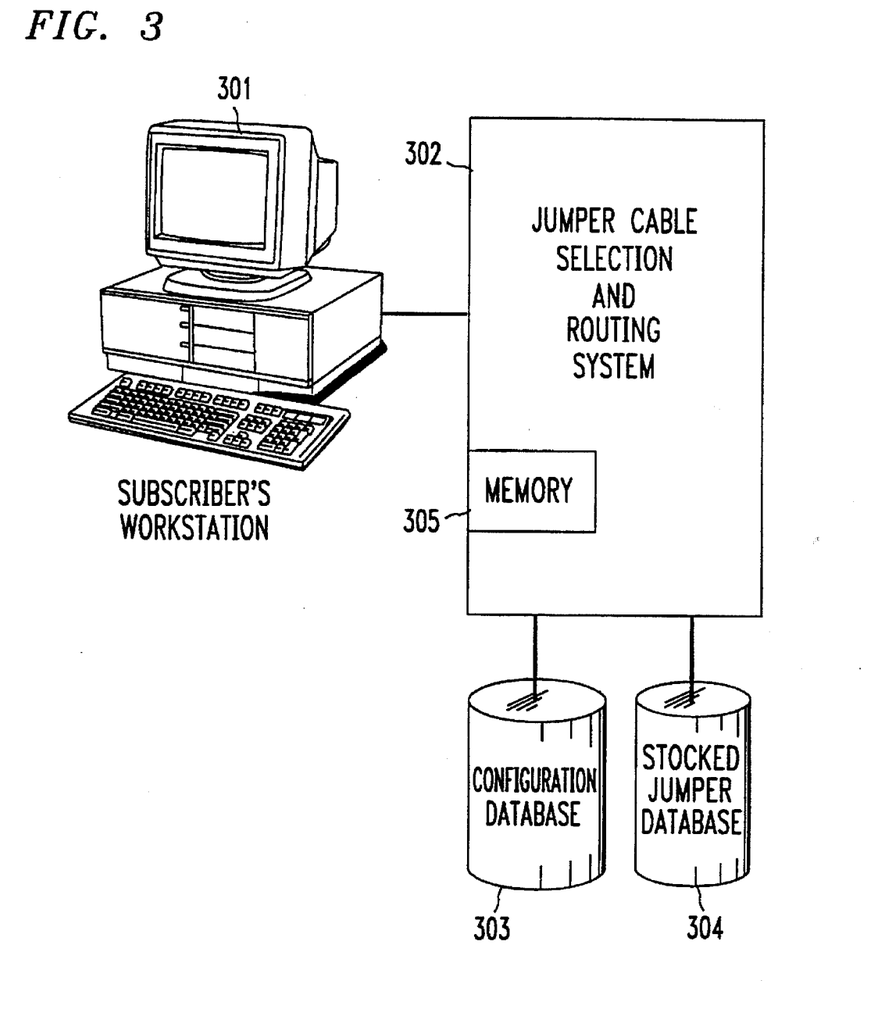
FIG. 3 illustrates the components of a jumper routing and selection system which receives coordinates of termination points and derives optimal non-congested jumper cable path and associated length for that cable in accordance with the invention.

FIG. 3 illustrates the components of a jumper routing and selection system which receives coordinates of termination points and derives optimal non-congested jumper cable path and length in accordance with the invention. In FIG. 3, a user, such as a cable installer, enters at workstation 301 the coordinates of termination points to be connected by a specific type (optical, metallic) of jumper cable. The input coordinates are received by jumper cable selection and routing system (JCSRS) 302 which is a processor with memory storage facilities 305 containing programming instructions, such as the ones illustrated in FIGS. 4, 5 and 6. Workstation 301 may be implemented using, for example, a Sparc 10 SUN® workstation with a SUN® display monitor. In such a workstation, processor 302 may be implemented using, for example, a Personal Computer (PC) Accelerator, which is a PC-DOS card with the firmware for the instructions of FIGS. 4, 5, and 6 being stored in memory 305.

Figure 4:
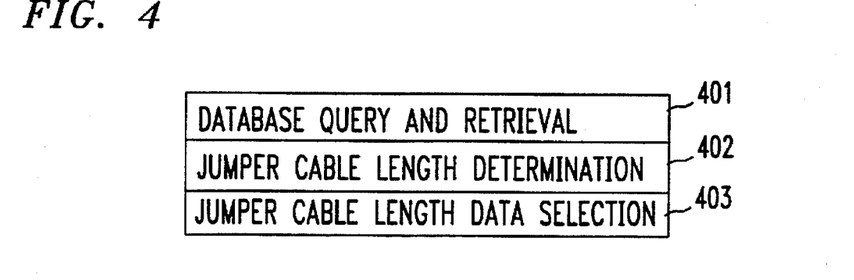
FIG. 4 shows sets of instructions stored in the memory of a processor in FIG. 3.

FIG. 4 shows sets of instructions stored in memory 305. Database query and retrieval instructions 401 include conventional database management software to access and update data stored in database-arranged files. Jumper cable length determination instructions 402 comprise a software program to calculate the length of a jumper cable according to the techniques described above. Jumper cable path selection instructions 403 include software which implements decision-based rules which analyze different paths through which a jumper cable connecting two termination points can be routed.

Referring back to FIG. 3, JCSRS 302 is also designed to query databases 303 and 304 to retrieve the necessary data to allow the decision-based rules to ascertain the optimal path through which a jumper cable connecting the two termination points is to be routed. The hardware and software components of JCSRS 302 can be included in workstation 301. Databases 303 and 304 may be implemented using, for example, database management systems software such as, Informix® SQL or Oracle® 4GL.

The physical configuration of frame 100 of FIG. 1 is stored in configuration database 303. More specifically, database 303 stores counters for each segment in the lower and upper raceways and each section in the vertical troughs. When a route is derived for two termination points in frame 100 and a connection is made for those points, the counter for each segment in the upper or lower raceway through which the cable is routed is incremented by "1". Similarly, the counters for the sections of the vertical troughs in the route are also incremented by "1". For example, the selection of the jumper cable route shown in FIG. 1 connecting termination points A and B in FIG. 1 would result in an increment of "1" to the counters of a) horizontal segments 1451, 1452 and 1453 and b) sections 1201 and 1251 of vertical troughs 120 and 125, respectively. As more jumper cables are connected to termination points in frame 100, counters would be incremented until some threshold value is reached. The threshold value indicates the maximum number of jumper cables that can be routed through either a segment of raceway 135 or 145 or a section of a vertical trough before congestion occurs in that particular segment or section. The threshold number is a function of the jumper cable diameter and the maximum height of jumper pile-up in a conduit as defined by industry standards, such as the two inch maximum height recommended by Bellcore in Technical Advisory TA-OPT-000449 issued Mar. 2, 1991. Also shown in FIG. 3 is stocked jumper database 304 which stores the standard length and the code number of premanufactured jumper cables.

Figure 5:
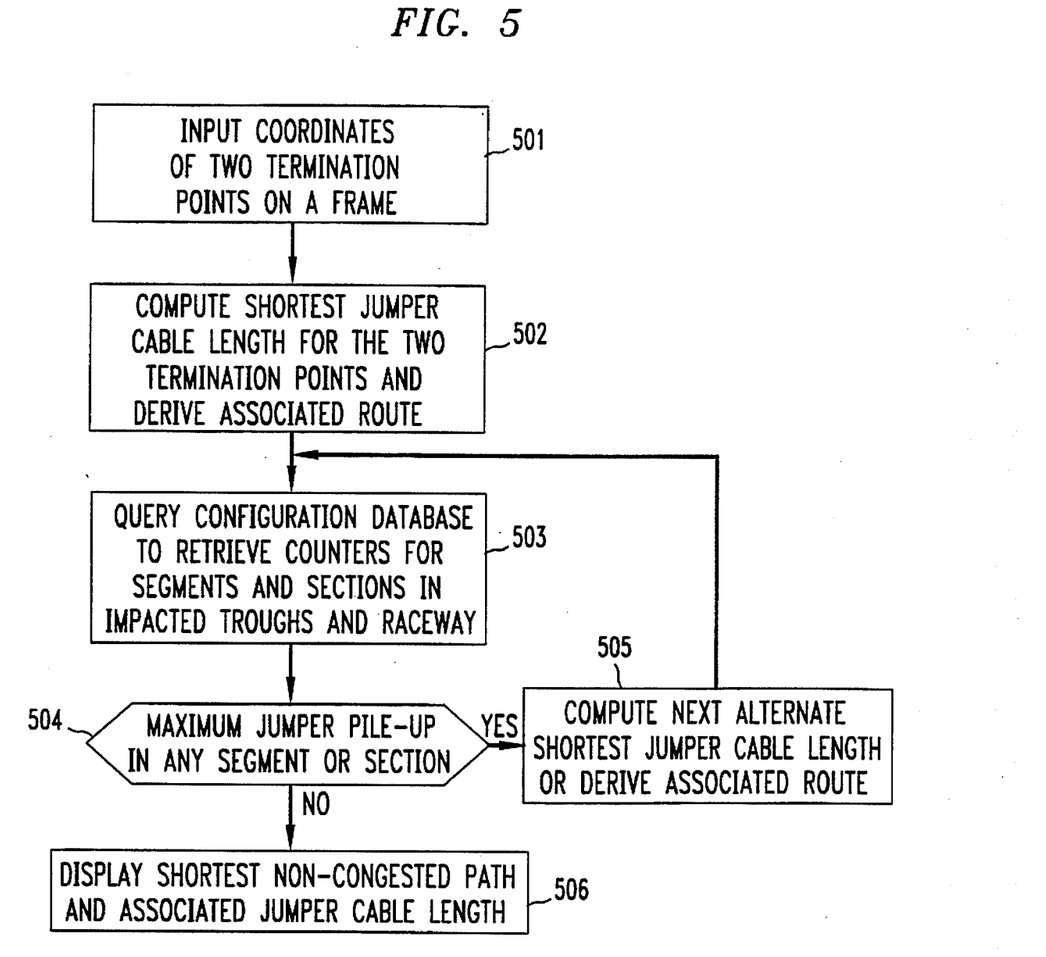
FIGS. 5 and 6 are flow diagrams representing functions performed by some of the components of FIG. 3.
Figure 6:
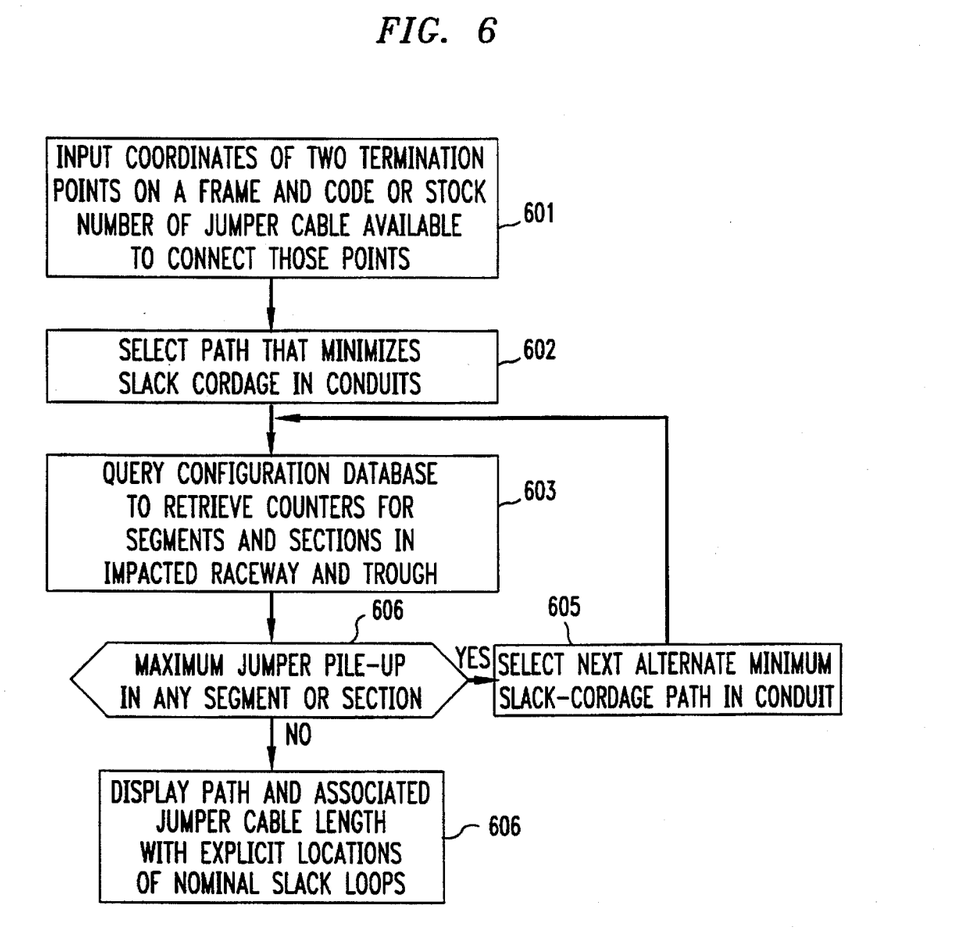

An illustrative embodiment of the process contemplated by the invention is initiated in step 501 of FIG. 5 when a user enters at workstation 301 the coordinates of two termination points to be connected by a specific type of jumper cable on frame 100 of FIG. 1. In step 502, JCSRS 302 uses the techniques described above to compute the minimum jumper cable length to connect those two points and to derive an associated route for that cable length.

Subsequently, JCSRS 302 queries configuration database 303 in step 503, to retrieve the counters for the segment(s) in the impacted raceway and the sections in the impacted vertical troughs. In step 504, each individual counter is compared to the threshold value to determine whether any of the impacted segments and sections is at maximum jumper pile-up capacity. If such is the case, JCSRS 302, in step 505 computes the next alternate shortest jumper cable route and length and then repeats steps 503 and 504. If no segment in the impacted raceway or section in the impacted vertical troughs is congested, the shortest non-congested path with a representation of the cable therein, and a measurement of the associated jumper cable length are displayed on workstation 301 in step 506.

Advantageously, this process allows cable installers to fabricate customized jumper cables to the exact size needed to connect two termination points without excess jumper slack cordage.

In contrast to customized jumper cables, Factory-made jumpers are fabricated in predetermined lengths. Typically, the use of the factory-made jumpers to connect two termination points result in some level of excess jumper slack cordage in the conduits of a distributing frame. An alternative embodiment of the process contemplated by the invention to minimize and control excess jumper slack cordage is initiated in step 601 of FIG. 6, when a cable installer inputs at workstation 301 the coordinates of two termination points in frame 100 and the code or stock number of a predetermined length jumper cable to connect those two points. JCSRS 302 in step 602 selects the route that minimizes slack cordage in the raceways and vertical troughs of frame 100. In step 603, JCSRS 302 queries configuration database 303 to retrieve counters for appropriate segments and sections in the impacted raceways and vertical troughs. A determination is made in step 604 as to whether the maximum jumper pile-up has been reached in any of the segments and sections in the impacted raceway and troughs. If so, JCSRS 302 selects the next alternate minimum slack-cordage-route and repeats steps 603 and 604 until a non-congested path that minimizes slack cordage is found. That path with a graphical representation of the cable therein is subsequently displayed on screen 301 in step 606 to assist the installer to guide the factory-made jumper cable in the conduits of the cable distribution system.

The foregoing is to be construed as only being illustrative embodiments of this invention. Persons skilled in the art can easily conceive of alternative arrangements providing functionality similar to these embodiments without any deviation from the fundamental principles or the scope of this invention.

We claim:

1. Apparatus for use in combination with a cable distribution system utilizing fiber optic cables with fixed predetermined lengths comprising:

means for receiving coordinates of two termination points within one or more frames in said distribution system; and means for determining a) a path within at least one trough of said one or more frames, said path being the shortest non-congested path between said points, b) the length of jumper cable to be routed through said path, and c) the minimum acceptable length of slack adjusting means comprising slack loops with a minimum acceptable radius of curvature.

2. The invention of claim 1 wherein said means for determining further includes means for evaluating level of congestion in a path of said cable distribution system by comparing existing jumper pile-up in said path to a predetermined industry-standard threshold.

3. The invention of claim 1 further comprising means for displaying a measurement of said jumper cable length.

4. The invention of claim 1 further comprising means for displaying said non-congested path with a graphical representation of said cable therein.

5. The invention of claim 1 further comprising means for retrieving from a database a premanufactured jumper cable length that is at least as long as said determined jumper cable length; and means for displaying a code for said premanufactured jumper cable.

6. The invention of claim 5 further comprising means for displaying a graphical representation of said premanufactured jumper cable within said non-congested path, said geographical representation including position of one or more of said slack loops within said jumper cable.

7. A system for selecting a path for a fiber optic jumper cable with a fixed length to connect to termination points within one or more frames in a cable distribution system comprising:

means for receiving a data indicative of a) said jumper cable including slack loops conforming to the minimum acceptable radius for said loop, and b) coordinates of said termination points;

means for selecting a jumper cable path through which said cable is to be routed, said path being a non-congested path that minimizes and troughs of said cable distribution system excess/cordage excluding said slack loop adjacent to said termination points.

8. The invention of claim 7 further comprising means for graphically displaying said path with a representation of said cable and positions of said nominal slack loops therein.

9. A method for determining in the optimal path for a fiber optic cable of fixed length comprising the steps of:

receiving coordinates of two termination points within one or more frames in a cable distribution system;

and determining a path within at least one trough of said distribution system, said path being the shortest non-congested path between said points and the length of a jumper cable, said path including slack loops conforming to the minimum acceptable radius in said loops, to be routed through said path.

10. The method of claim 9 wherein said step of determining said non-congested path includes the step of comparing existing jumper pile-up in paths of said cable distribution system to predetermined industry-standard threshold.

11. The method of claim 9 further comprising the step of:

displaying a measurement of said jumper cable length.

12. The invention of claim 9 further comprising the step of:

displaying said non-congested path with a graphical representation of said cable therein, said graphical representation including position of one or more, of said slack loops within said jumper cable.

13. The invention of claim 9 further comprising the steps of:

retrieving from a database a premanufactured jumper cable length closest to, but as long as, said determined jumper cable length; and displaying a code for said premanufactured jumper cable.

14. The invention of claim 13 further comprising the step of:

displaying a graphical representation of said premanufactured jumper cable within said non-congested path, said graphical representation including position of one or more, of said slack loops in said jumper cable.

15. A method for selecting a path for fiber optic cable comprising the steps of:

selecting a first jumper cable path between two termination points in a cable distribution system; and if the first selected path is congested selecting longer paths between said two termination points until a non-congested path has been selected and determining the shortest jumper cable length to be routed through said non-congested route, said length including slack loops conforming to the minimum acceptable radius in said loop.

16. The method of claim 15 wherein said first selected path is the shortest path.

17. The method of claim 15 further comprising the step of displaying a measurement of said jumper cable length.

18. The method of claim 15 further comprising the step of displaying said non-congested route with a graphical representation of said cable therein.

19. The method of claim 15 further comprising the steps of querying a database to check existing jumper pile-up in a selected jumper cable path; and ascertaining whether said jumper pile-up exceeds a predetermined industry-standard threshold to determine whether said selected jumper cable path is congested.

20. A method for connecting a fiber optic cable of a fixed length to two termination points in a cable distribution system comprising the steps of:

receiving data indicative of a) said jumper cable length including slack loops of a minimum acceptable radius, and b) coordinates of said termination points;

selecting a jumper cable path through which said cable is to be routed said path being a non-congested path that minimizes in conduits of said cable distribution system access cordage excluding said slack loops.

21. The invention of claim 20 further comprising graphically displaying said path with a representation of said cable and positions of slack loops therein.

22. A method for selecting a fiber optic jumper cable with a fixed length to be used to connect two termination points within a cable distribution system, said method comprising the steps of:

receiving data indicative of a) coordinates within said distribution system of termination points and b) the length of said jumper cable including slack loops with a minimum acceptable radius, said length greater than the length of the shortest non-congested path within said cable distribution system between said termination points; and selecting a non-congested path within said cable distribution system between said termination points which is longer than said shortest non-congested path.

23. The invention of claim 2 further comprising means for increasing a counter for each jumper cable routed to a particular trough; and means for determining whether said counter is less than or equal to a predetermined threshold before routing a jumper cable through said trough.

* * * * *